United States Patent [19]

Armando

[11] Patent Number: 4,997,393

[45] Date of Patent: Mar. 5, 1991

[54] HOUSING ASSEMBLY FOR PLUG-IN ELECTRICAL ELEMENT HAVING BLADE-TYPE TERMINALS

[75] Inventor: John E. Armando, River Grove, Ill.

[73] Assignee: Littelfuse, Inc., Des Plaines, Ill.

[21] Appl. No.: 328,102

[22] Filed: Mar. 23, 1989

[51] Int. Cl.⁵ .................... H01R 13/68; H01R 13/66
[52] U.S. Cl. ................................ 439/620; 439/621; 337/260; 333/181
[58] Field of Search ............... 324/508, 538; 333/181; 337/4–6, 255, 260; 439/620–622

[56] References Cited

U.S. PATENT DOCUMENTS

| | | |
|---|---|---|
| 2,117,346 | 5/1938 | Millis . |
| 2,819,434 | 1/1958 | Mattheyses ................... 439/679 |
| 2,958,069 | 10/1960 | Redick et al. . |
| 3,629,662 | 12/1971 | Cattey et al. ................... 439/620 |
| 3,833,879 | 9/1974 | Aidn et al. ................... 439/741 |
| 3,962,782 | 6/1976 | Williamson et al. . |
| 4,023,264 | 5/1977 | Schmidt, Jr. et al. . |
| 4,116,524 | 9/1978 | DeNigris et al. ................... 439/620 |
| 4,126,369 | 11/1978 | Rapata et al. ................... 439/620 |
| 4,178,061 | 12/1979 | Ahroni . |
| 4,220,393 | 9/1980 | Ammon et al. ................... 439/682 |
| 4,224,592 | 9/1980 | Urani et al. . |
| 4,290,183 | 9/1981 | Tait . |
| 4,306,374 | 12/1981 | Wharrie ................... 439/678 |
| 4,344,060 | 8/1982 | Ciesemier et al. ................... 337/260 |
| 4,434,548 | 3/1984 | Beswick . |
| 4,504,816 | 3/1985 | Viola et al. . |
| 4,672,352 | 6/1987 | Takano . |

FOREIGN PATENT DOCUMENTS

81/01627 6/1981 PCT Int'l Appl. .
2090081 6/1982 United Kingdom .

Primary Examiner—Gary F. Paumen
Attorney, Agent, or Firm—Wallenstein, Wagner & Hattis, Ltd.

[57] ABSTRACT

A fuse assembly has a one-piece molded housing providing alignment and guiding surfaces for insertion of a generally planar fuse assembly having side elements carrying a fuse link or diode therebetween. In one version the housing has an open bottom through which terminal blades formed as extensions of the side elements extend. A load-bearing structure prevents accidental fuse element assembly withdrawl from the housing. Polarized terminals for polarized devices such as diodes are provided by twisting one of the initially coplanar blades 90°. The twisted joining portion between the so rotated terminal blade and its remaining structure inside the housing is disposed completely within the housing so as to provide a flushmounting plug-in structure. A laterally extending non-current carrying extension of at least one of the terminal blades spans the major dimension of the housing interior at the bottom thereof to provide a measure of protection against entanglement of such devices when they are shipped or stored loosely.

5 Claims, 3 Drawing Sheets

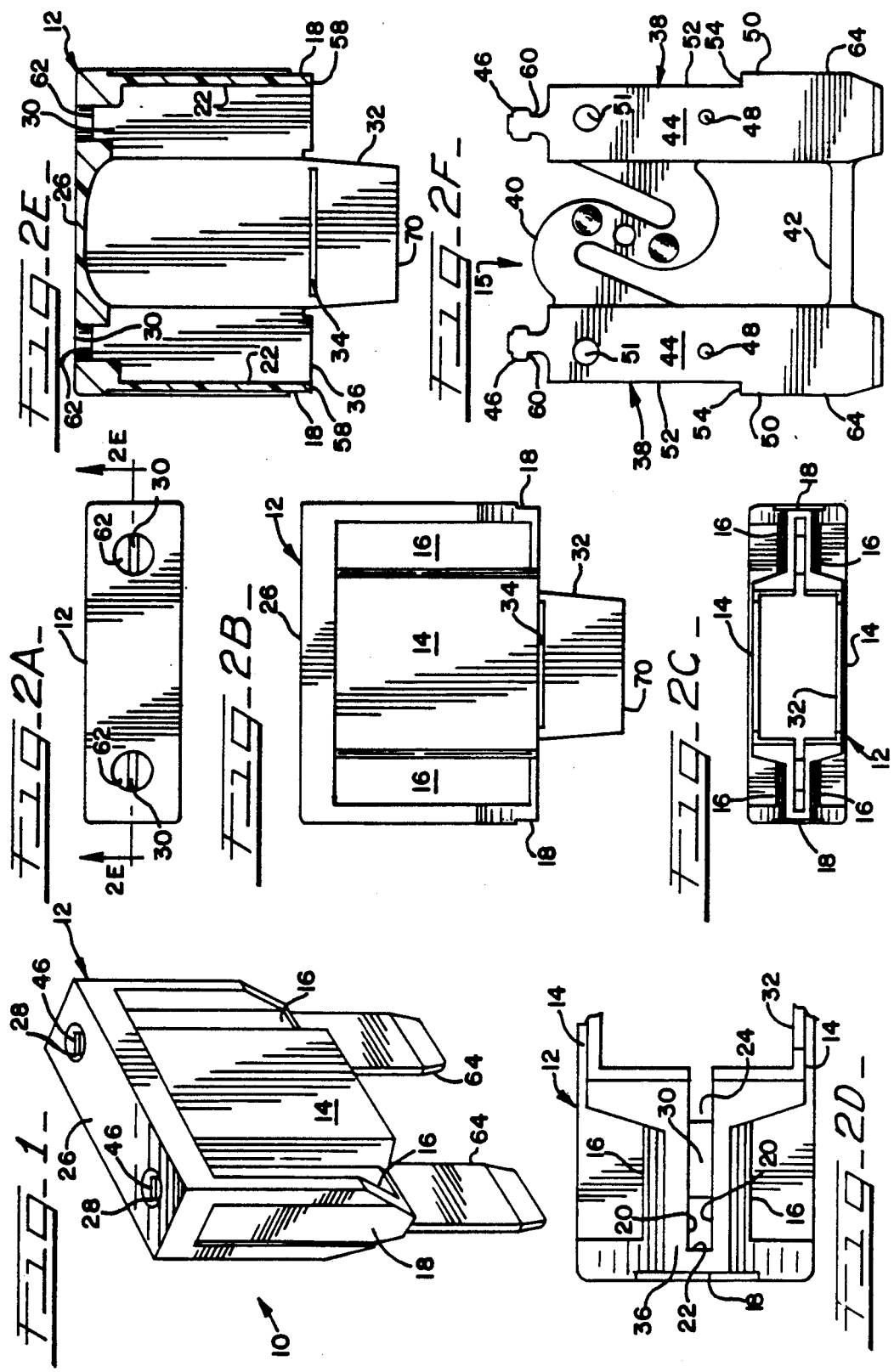

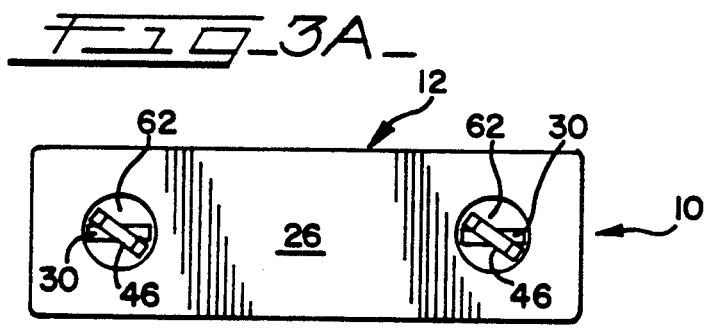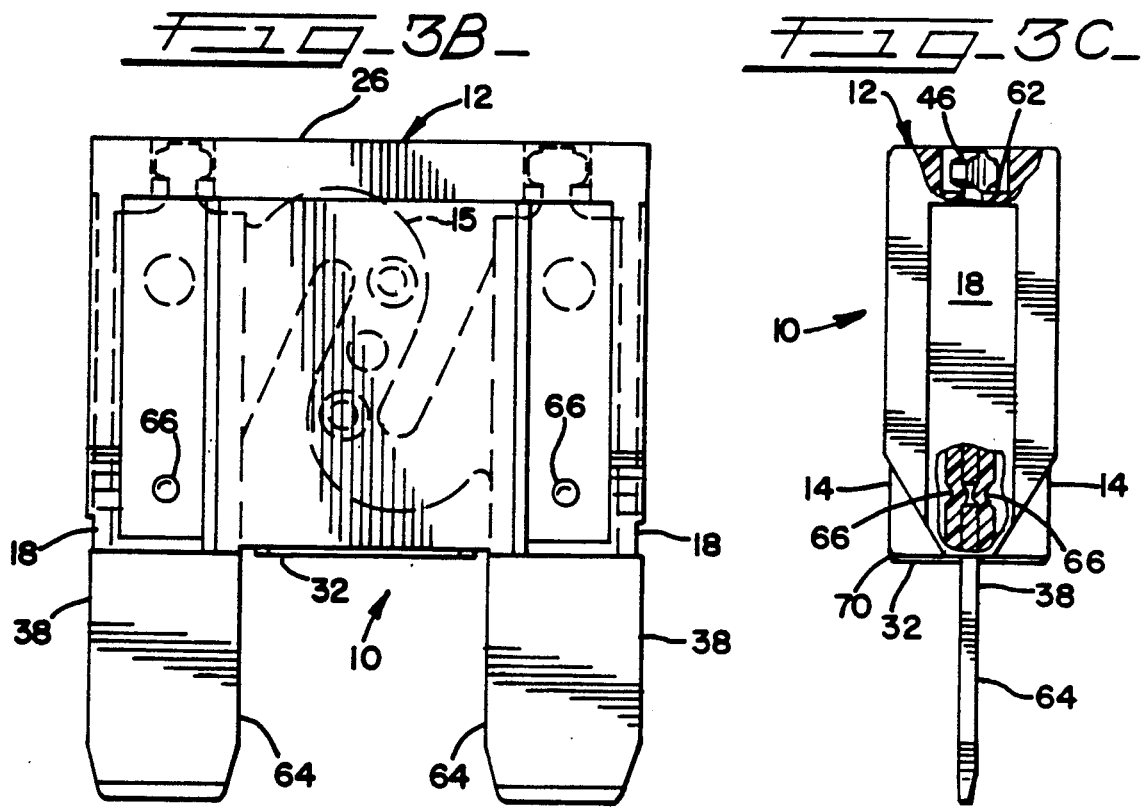

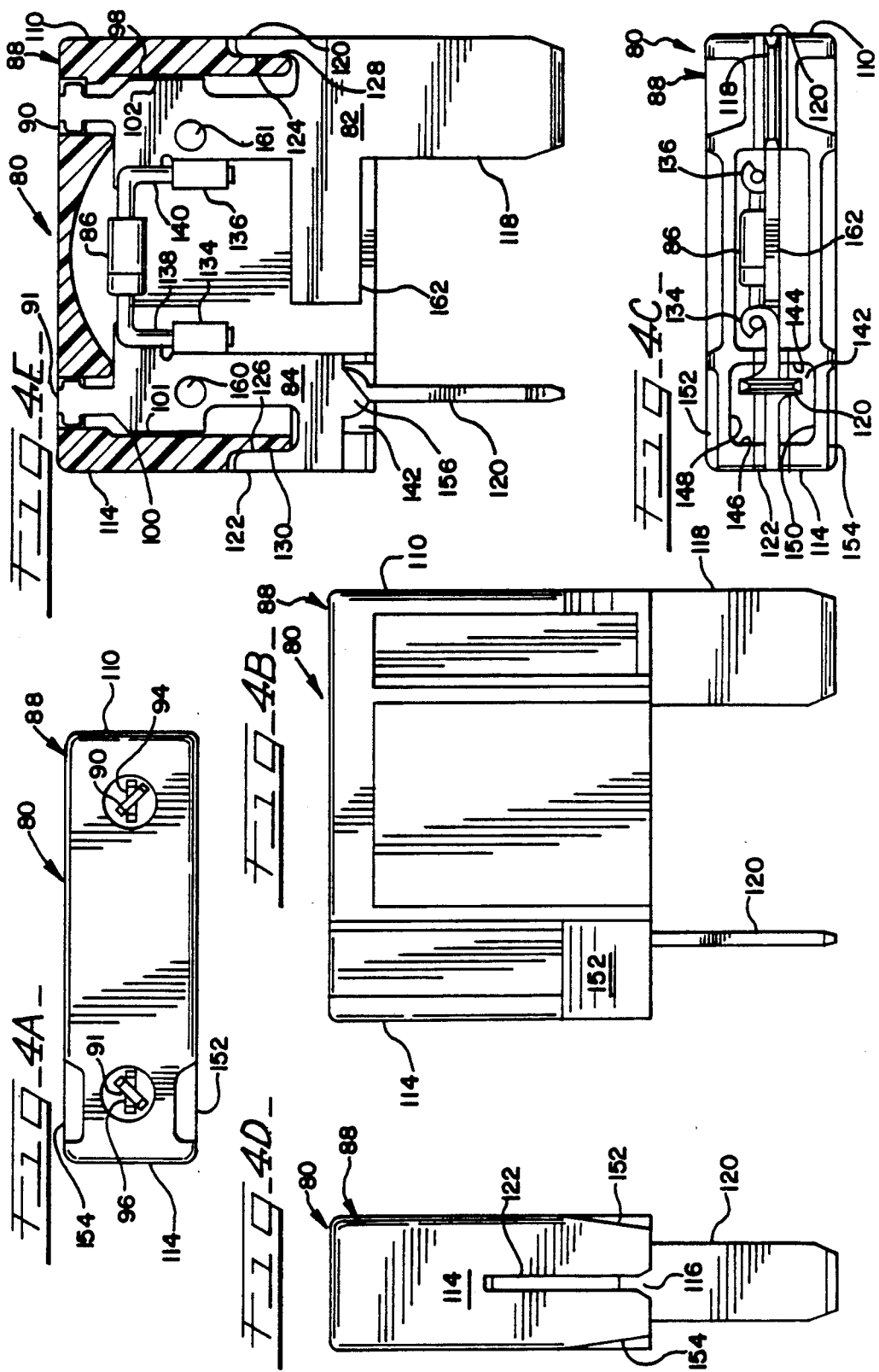

HOUSING ASSEMBLY FOR PLUG-IN ELECTRICAL ELEMENT HAVING BLADE-TYPE TERMINALS

DESCRIPTION

1. Technical Field

The field of the invention is the plug-in electrical device art, and in particular plug-in electrical fuses and rectifiers.

2. Background Art

Inexpensive automotive blade-type fuses are frequently manufactured by forming an all-metal fuse element consisting of a pair of coplanar plug-in blade-forming conducting side elements joined together by an integrally formed fuse link. An insulating housing is then applied over the fuse link and part of the side blade elements. The housing is preferably pre-formed as a one-piece unit prior to assembly with the fuse element. In such cases, the housing has an open end which is applied over the fuse element. A securing step is then carried out to securely anchor these fuse side elements to the housing.

This bottom opening, however, provides an undesired entry point for foreign objects, or terminal blades of adjacent fuses, causing adjacent fuses to become stuck together when fuses are loosely stored in a common container. If the housing is molded completely around the side elements or formed from a pair of shells, then there is no pass-through opening to cause a jamming problem. Molding a housing around a fuse element in many cases causes problems, such as maintaining a spacing with the face link, which makes molding the housing undesirable.

One solution to the jamming problem is shown in U.S. Pat. No. 4,344,060 which provides a foldable flap on one side of this pass-through opening which is initially located to one side of the opening where the fuse and terminal assembly is inserted into the housing (or the housing is alteratively fitted over the assembly). The flap is then folded to cover the opening. This is unsatisfactory if the housing must be made of a synthetic plastic material which is not readily bendable or which, if bendable, can crack at the fold point. A simple reliable means for blocking the pass through opening which does not require any closure flap on the housing would be distinctly advantageous.

Semiconductor diodes are routinely used in the automotive industry as interior components of alternators and as components hard-wired to electrical relays for surge suppression purposes. Another aspect of the invention is to provide a unique plug-in rectifier unit which can be produced at minimum cost.

SUMMARY OF THE INVENTION

The various features of the invention to be described are most useful when applied to a fuse assembly construction which comprises an initially generally planar blade-type fuse element stamped from a strip of fuse metal and having a pair of confronting terminal blade-forming portions joined together by a fuse link. Where a rectifier is involved, the fuse link is replaced by a rectifier having terminals anchored by unitary tabs extending from blade-forming portions and bent around the rectifier terminals. A one-piece housing is preferably provided with alignment passages guidingly aligning terminal blade-forming portions along interior housing passages during insertion of the fuse or rectifier element into an open-bottom portion of the housing.

In the preferred form of one aspect of the invention the upper ends of the blade-forming portions are provided with small extensions lying in prolongation thereof and forming deformable locking tabs. The housing is provided at the top face thereof with tab-accepting test-probe slots through which the locking tabs pass during assembly. The fuse or rectifier element is secured in place by twisting the tabs at points where they exit the top surface of the housing to a state of permanent deformation. The blade-anchoring region is thus well removed from the hot-running central portion of the side elements adjacent to the fuse element itself, and further does not involve a plastic-to-plastic hot seal. The inward movement of the lower terminal blade-forming portions of the metal portion of the fuse may be provided by staking portions of the housing into staking apertures near the bottom portion of the housing or preferably by other means to be discussed.

According to a feature of the invention, one or more laterally extending projections from the terminal-forming blade portions at points near the open bottom of the housing are provided and oriented so as to span at least substantially across the open housing bottom, but without forming a short circuit between the final terminal blades. These extensions are configured to form a barrier against insertion of foreign objects, and in particular the terminal blade of a similarly configured assembly where the fuse or rectifier elements are stored in a common container.

With respect to the just described barrier forming tabs, United Kingdom prior art Patent Application 2,090,081 discloses a fuse with an open bottom housing and test probe apertures at the top thereof, upwardly extending wings or projections on the terminal blades within the housing which fit into housing apertures which prevent the terminal blades from collapsing inwards together, and a fuse link whose terminals are connected between inwardly extending tabs located in the bottom half of the housing. These tabs are disclosed as mounting terminals for the fuse and if, as in the present fuse and rectifier embodiments of the invention, these attachment tabs are spaced well above the bottom of the housing, they would not act as barriers against entry of terminal blades of other fuses. Moreover, the open bottom of the housing shown therein is substantially smaller than the width of a blade, as a result of which the previously mentioned entanglement problem cannot arise.

According to another feature of the invention, rectifying diodes particularly suited to automotive automatic services are provided in a housing having polarized terminals configured for insertion into a correspondingly configured connector block. Such diodes are thus easily replaced in the event of diode failure, completely eliminating the necessity of, for example, tearing down the alternator to replace the defective diode therein. When used in conjunction with a relay for surge suppression purposes, similar consideration apply. Additionally, space saving in the alternator housing or in the relay housing is similarly affected. In the preferred form of the invention one of the terminal blades is twisted by a 90 degree rotation out of coplanarity with the remaining portion within the housing to provide for one-way insertion into the connector block. The joining region is configured to lie wholly within the device housing so that the housing base will fit flush against such a connector block.

U.S. Pat. No. 3,833,879 which is prior art to the present invention, shows the twist-locking of plug-in terminal blades of an electrical device. It does not teach nor suggest use of such a structure with a plug-in diode in an open-bottom housing.

Other features and advantages of the invention will become apparent upon making reference to the specification, claims and drawings to follow. One such feature involves the use of a barrier flap on the housing of the electrical device where the flap can be bent after insertion of the use or rectifier element into the associated housing. The flap is uniquely designed to minimize reliability problems heretofore encountered in the use of such flap.

BRIEF DESCRIPTION OF DRAWINGS

FIG. 1 is a perspective view of an assembled fuse.

FIG. 2A is a plan view of a fuse housing before assembly.

FIG. 2B is a front elevation of the housing of FIG. 2A.

FIG. 2C is a bottom view of the housing of FIG. 2A.

FIG. 2D is an expanded view of a portion of FIG. 2C.

FIG. 2E is a cross sectional view of the housing shown in FIG. 2A taken along the cut lines indicated.

FIG. 2F shows a fuse assembly positioned for insertion into the fuse housing of FIG. 2E.

FIG. 3A is a top view of the assembled fuse.

FIG. 3B is a front elevation of the assembled fuse.

FIG. 3C is a partially cutaway side view of the assembled fuse.

FIG. 4A is a top view of a polarized device assembly.

FIG. 4B is a front elevational view of the assembly of FIG. 4A.

FIG. 4C is a bottom view of the assembly of FIG. 4A.

FIG. 4D is a side elevational view of the assembly of FIG. 4A.

FIG. 4E is a cutaway front view of the assembly of FIG. 4A.

DETAILED DESCRIPTION

While this invention is susceptible of embodiment in many different forms, there is shown in the drawings and will herein be described in detail a number of different embodiments of the invention with the understanding that the present disclosure is to be considered as an exemplification of the principles of the invention and is not intended to limit the broad aspect of the invention to the embodiment illustrated.

Referring now to the Figures, FIGS. 1, 3A-3C show a completed fuse assembly 10 of the present invention, FIGS. 2A-2E show a fuse housing 12, and FIG. 2F shows a fuse element assembly 15. Since FIGS. 3A-3C contain the same elements as FIGS. 1 and 2A-2F, only FIGS. 1 and 2A-2F will be described as follows.

The fuse housing 12 is preferably a one-piece molded plastic element, and is shown in the drawings as being of opaque material to simplify the drawings. In the preferred form of the invention it is made of a transparent material to allow visual inspection of the fuse to see if it is has blown. The housing is generally rectangular in shape, having opposing major faces 14, each major face having disposed on either side thereof a contiguous recessed face 16 conjoined by housing sidewalls 18.

Referring in particular to FIGS. 2A and 2D, the resulting structure has two pairs of interior confronting surfaces 20 corresponding to the recessed faces 16 and conjoined at the outer edges by planar interior sidewall surfaces 22. These interior surfaces 20 and interior sidewall surfaces 22 form alignment passages 24 for an inserted fuse assembly, as will subsequently be described. The top ends of these insertion passages 24 terminate at the interior of the top face 26 of the housing 12, the housing top face being provided with a generally cylindrical recess 28 (FIG. 1) at the end of each insertion passage 24, each locking recess communicating with the interior of the housing 12 through a locking slot 30. Extending centrally downward from one major face of the housing 12 is a generally rectangular sealing flap 32 provided with an elongated slot 34 disposed along a line joining the lower end 36 of the housing 12.

FIG. 2F shows the fuse element assembly 15 positioned for insertion into the housing 12 of FIG. 2E. The assembly 15 is generally planar, having major coplanar side elements 38 each in the form of elongated strips having major faces 44 and joined by a fuse link 40 and a handling web 42. At the upper end of each side element 38 is a small extension 46 forming a locking tab, the purpose of which will subsequently be explained. Staking holes 48 are provided centrally in the side elements 38 to assist in final assembly of the structure. Additionally, indexing holes 51 are provided passing through the major faces 44 to assist in handling the assembly 15 during fabrication. The side elements 38 are provided with coplanar extensions 50 extending laterally outward from the outer edges of the side elements to provide stop-forming shoulders 54 on the lower or blade-forming ends 64 of each side element 38.

The upper ends of the fuse element assembly 15 are placed into the insertion passages 24 of the housing 12 and the assembly is then forced upwards thereinto until the blade shoulders 54 arrestingly strike the housing lower end surfaces 58. The outer edges 52 of the side elements 38 are aligningly guided by the interior side wall surfaces 22. The side elements 38 are dimensioned so that when the insertion process is so arrested, the locking tabs 46 extend through the locking slots 30 to project well upward into the locking recesses 28. The locking tabs are then twisted approximately 45° to remain permanently deformed in this position, causing the lower faces 60 of the locking tabs 46 to lockingly confront the locking shoulders 62 formed at the bottom of each locking recess 28. The fuse assembly 15 is now permanently and safely secured against extraction from the housing 12.

To provide additional strength against inward terminal flexure, portions of the recessed housing faces 16 are locally melted into the staking holes 48 to form dimples 66 in the housing 12 to provide additional anchoring in this region. This staking operation typically provides adequate strength against normally encountered blade flexure, but is inadequate to prevent accidental extraction of the assembly 15 from the housing 12.

Thereafter web 42 is removed, leaving isolated bladeforming ends in the form of terminal blades 64. Either at this point or immediately prior thereto, the flap 32 is rotated about the axis formed by the slot 34 to span across the bottom of the housing, whereupon the lower end 70 of the flap is ultrasonically sealed in an abutting relationship to the bottom end of the opposing major face 14. This provides a fuse housing which protects the fuse element from possibly damaging contact with foreign objects during handling.

Assemblies and structures as described hereinabove, but not having such a slot 34, have been on sale in the United States for more than one year prior to the filing of the instant application.

Experimentally it has been found that such a slot 34 is necessary if reliable ultrasonic sealing is to be achieved, since residual stresses about the joining axis in unslotted flaps 32 frequently give rise to sealing failure. Attempts to overcome this by embossing a line along the joining axis proved similarly unsuccessful. Provision of the slot 34, however, eliminates this problem. Assemblies and structures as described hereinabove have been on sale in the United States for more than one year prior to the filing of the instant application.

FIGS. 4A-4E show a plug-in assembly for polarized devices, such as diodes, employing some of the design principles set forth above. The assembly 80 is shown in final assembled form; however, the assembly procedures follow along the general lines recited above. In more detail, the device assembly 80 is fabricated from a pair of coplanar terminal members 82, 84 carrying a polarized device 86 attached therebetween and slid up into a housing 88. As in the case of the fuse assembly previously described, extension tab 90, 91 pass through slots 94, 96, whereupon they are deformingly rotated to secure the terminal members 82, 86 in place. Each terminal member 82, 84 has inwardly offset outer edges 98, 100 aligningly and supportingly engaged with confronting opposing housing sidewall inner surfaces 102, 104. Each of the housing sidewalls 110, 114 has a downwardly extending slot 116 (one not shown) at the lower end thereof. The lower ends of the terminal members 82, 84 are configured to form terminal blades 118, 120. Blade extensions 120, 122 disposed in prolongation of the outer edges of their respective terminal blades 118, 120 have inner surfaces 124, 126 configured to nestingly engage with recesses 128, 130 in the sidewalls 110, 114 disposed in upward prolongation of the sidewall slots 116. Thus, with the side members 82, 84 secured at their top ends by their respective locking tabs 90, 91, their upper ends secured against outward movement by engagement with the sidewall inner surfaces 104, 102, the terminal members are further secured against inward movement at their lower end by the engagement of the blade extensions 120, 122 with their associated sidewall recesses, 128, 130. As shown in the drawings, the device 86 is secured by means of wrap-around tabs 134, 136 securing device leads 138, 140; however, a variety of alternative attachment systems may be used, as well be evident to those skilled in the art.

The device assembly 80 is configured for use with a polarized device, such as a diode, as a result of which it is important to insure that it can not be plugged into an associated mounting block in improper orientation. To this end the terminal blade 120 is permanently twisted by 90° about its axis. Thus, the device assembly 80 cannot be accidentally installed in reverse polarity in its associated plug, and also it cannot be accidentally installed into a plug designed to accommodate assemblies such as those shown in FIGS. 1-3C.

To accommodate the rotated terminal blade 120, the housing 88 is configured with a cavity 142 at the base thereof defined by a shroud-forming inner portion 146 of the outer sidewall 114, an inner wall 144, and confronting inner portions 148, 150 of the front and rear surfaces 152, 154. The upper end of the terminal 120, as well as its joining portion 156 are thus completely accommodated within the housing 88 so that when inserted into an appropriately configured mounting block or socket the housing will seat flush to the surface thereof. The holes 160, 161 shown at the upper regions of the terminal members 82, 84 are used purely for indexing and handling of the punched strap stock from which the terminal members 82, 84 are fabricated, and are not necessary to secure the device assembly 80 together.

As mentioned in the Background of the Invention, when one-piece device assemblies such as those shown in FIGS. 4A-4C are not provided with a sealing flap 32 (FIG. 2B), an entanglement problem is frequently observed when such assemblies are shipped or otherwise stored loosely and in large numbers in a container. This entanglement problem arises when two assemblies of the type shown in FIGS. 4A-4C are placed in base-to-base juxtaposition, in which case a terminal blade of one assembly may enter the central passageway between the two terminal blades of the neighboring assembly, thereby entangling the two assemblies. A significant measure of protection against such entanglement is secured by providing a laterally extending extension strap 162 integral and coplanar with the right-hand terminal blade 118. If desired, the extension strap 162 may be provided with front-to-rear extending tabs to generally span the central interior of the housing 88.

While the invention has been described with reference to a preferred embodiment, it will be understood by those skilled in the art that various changes may be made and equivalents may be substituted for elements thereof without departing from the broader aspects of the invention. Also, it is intended that broad claims not specifying details of a particular embodiment disclosed herein as the best mode contemplated for carrying out the invention should not be limited to such details. Furthermore, while, generally, specific claimed details of the invention constitute important specific aspects of the invention in appropriate instances even the specific claims involved should be construed in light of the doctrine of equivalents.

I claim:

1. In an electrical device including a hollow housing having an aperture at the bottom thereof, electrical-device forming means disposed within said housing, and a plurality of plug-in terminals extending from said device-forming means and having lower portions extending from said aperture, said device-forming means and terminals being initially formed as an integral unit and thereafter inserted into said housing through said bottom aperture means, said device-forming means being thereafter secured to said housing, the improvement comprising:

at least one of said terminals having integral therewith a laterally non-current-carrying extension disposed within said housing between the points where said device-forming means makes connection with said plug-in terminals and said housing bottom and configured to extend along said bottom aperture sufficiently to form at least a partial barrier against insertion thereinto a foreign object.

2. The device of claim 1 wherein said extension is configured to form at least a partial barrier against insertion into said bottom aperture of the terminal of a similarly configured electrical device.

3. The device of claim 1 wherein said device is a two-terminal device and said device-forming means comprises a two-terminal device connected between said terminals.

4. In an electrical device including a hollow housing having an aperture at the bottom thereof, electrical device-forming means disposed within said housing, and a plurality of plug-in terminals extending from said device-forming means and having lower portions extending from said aperture, said device-forming means and terminals being initially formed as an integral unit and thereafter inserted into said housing through said bottom aperture means, said device-forming means being thereafter secured to said housing, the improvement comprising:

at least one of said terminals having integral therewith a laterally non-current-carrying extension disposed within said housing between said device forming means and said housing bottom and configured to extend along said bottom aperture sufficiently to form at least a partial barrier against insertion thereinto a foreign object, and wherein said device-forming means is a two-terminal rectifying diode.

5. An electrical device comprising: a pair of generally parallel elongated strap-shaped terminals each having a terminal blade-forming end and a lock-forming end, said lock-forming ends being generally strap-shaped portions initially coplanar with each other; connected between said terminals at a point intermediate each of said respective terminal ends; and a hollow housing having a base aperture in a base-forming end of said housing, said housing having confronting major walls providing supporting surfaces having aligning portions for aligningly supporting said terminals within said housing with said blade-forming ends extending from said base aperture, a pair of locking apertures passing through the opposite end of said housing which forms a housing top, each aperture being configured to acceptingly pass one of said lock-forming ends therethrough upon insertion of said mounting assembly into said base aperture means, said lock-forming ends of said terminals being lockingly deformed at outermost end portions thereof beyond said locking apertures to secure said terminals assembly against withdrawal by an outwardly directed force applied to said blade-forming ends, and means for securing said terminal blade-forming ends against lateral movement, at least one of said terminal blade-forming ends being rotated out of coplanarity with its lock-forming end at a joining region therebetween so as to be configured for insertion in only one orientation into complementarily configured polarized socket means, said joining region being wholly contained within said housing.

* * * * *